(12) United States Patent
Kim et al.

(10) Patent No.: US 11,309,101 B2
(45) Date of Patent: Apr. 19, 2022

(54) CONDUCTIVE PASTE FOR SOLAR CELL ELECTRODE AND SOLAR CELL MANUFACTURED BY USING SAME

(71) Applicant: LS-NIKKO COPPER INC., Ulsan (KR)

(72) Inventors: Chung Ho Kim, Namyangju (KR); Hwa Young Noh, Hwaseong (KR); Mun Seok Jang, Seoul (KR); Tae Hyun Jun, Seongnam (KR); In Chul Kim, Yongin (KR); Min Soo Ko, Seoul (KR)

(73) Assignee: LS-NIKKO COPPER INC., Ulsan (KR)

( * ) Notice: Subject to any disclaimer, the term of this patent is extended or adjusted under 35 U.S.C. 154(b) by 0 days.

(21) Appl. No.: 16/346,070

(22) PCT Filed: Oct. 18, 2017

(86) PCT No.: PCT/KR2017/011510
§ 371 (c)(1),
(2) Date: Jun. 26, 2019

(87) PCT Pub. No.: WO2018/080094
PCT Pub. Date: May 3, 2018

(65) Prior Publication Data
US 2020/0098487 A1 Mar. 26, 2020

(30) Foreign Application Priority Data

Oct. 31, 2016 (KR) .................. 10-2016-0143686

(51) Int. Cl.
*H01B 1/22* (2006.01)
*H01L 31/0216* (2014.01)
(Continued)

(52) U.S. Cl.
CPC ......... *H01B 1/22* (2013.01); *H01L 31/02167* (2013.01); *H01L 31/022425* (2013.01); *H01L 31/18* (2013.01)

(58) Field of Classification Search
CPC ................ H01B 1/22; H01L 31/02167; H01L 31/022425; H01L 31/18; Y02E 10/50; Y02P 70/50; C07F 7/08
See application file for complete search history.

(56) References Cited

U.S. PATENT DOCUMENTS

2014/0124713 A1* 5/2014 Majumdar ............. H01L 29/45
252/513
2015/0249167 A1* 9/2015 Zhang ................ H01B 13/0016
427/123

(Continued)

OTHER PUBLICATIONS

Heo, S.W. et al., "Patternable solution process for fabrication of flexible polymer solar cells using PDMS," Solar Energy Materials & Solar Cells 95 (2011) 3564-3572 (Year: 2011).*

(Continued)

*Primary Examiner* — Mark Kopec
*Assistant Examiner* — Jaison P Thomas

(57) ABSTRACT

The present invention relates to a conductive paste for a solar cell electrode, including a metal powder, a glass frit, an organic binder, a silicone-based additive and a solvent, wherein the silicone-based additive includes trimethylsiloxy-terminated polydimethylsiloxane, whereby an electrode formed using the conductive paste can be improved in aspect ratio, that is, line width and line height, thus increasing conductivity, and a solar cell having high power generation efficiency can be provided by enlarging the light-receiving surface through decreasing the line width of the electrode.

13 Claims, 2 Drawing Sheets

(51) Int. Cl.
*H01L 31/0224* (2006.01)
*H01L 31/18* (2006.01)

(56) References Cited

U.S. PATENT DOCUMENTS

| | | | |
|---|---|---|---|
| 2018/0114607 A1* | 4/2018 | Lee | C09D 5/24 |
| 2018/0175220 A1* | 6/2018 | Hilali | H01B 1/22 |
| 2020/0098487 A1* | 3/2020 | Kim | C07F 7/08 |

OTHER PUBLICATIONS

International Search Report for PCT/KR2017/011510 dated Jan. 23, 2018.

* cited by examiner

[fig. 1]
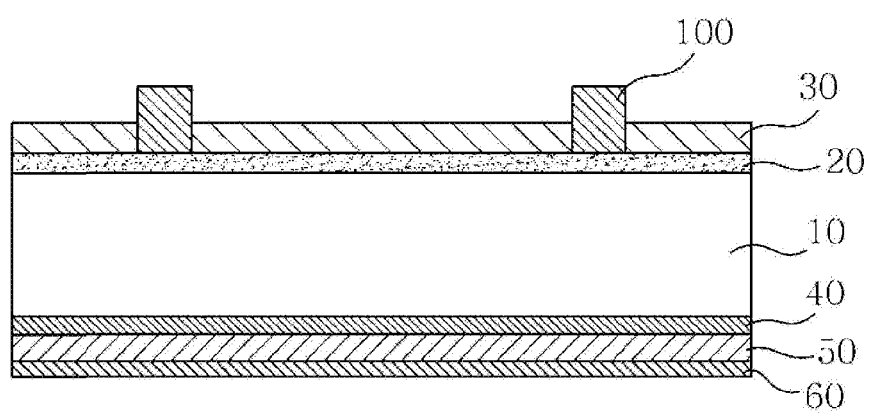

[fig. 2]
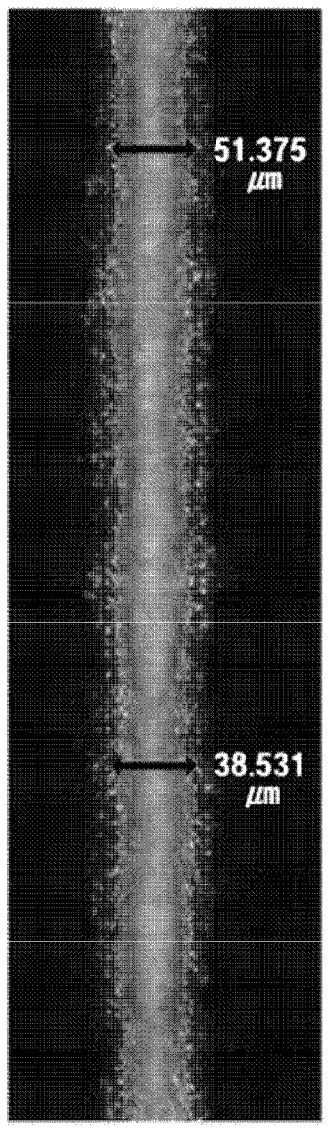 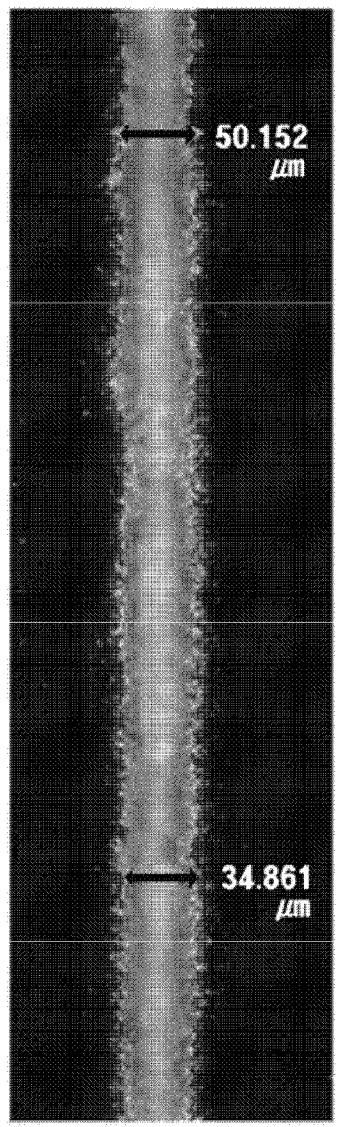 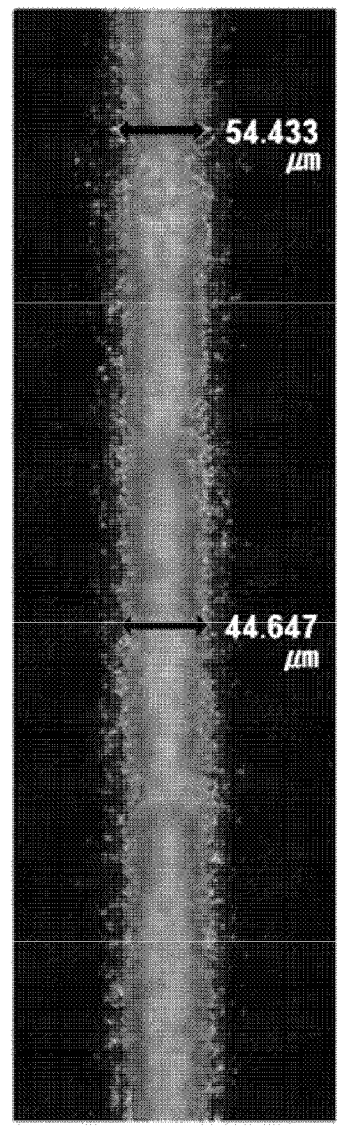
Example 1　　　Example 2　　　Comparative Example 1

CONDUCTIVE PASTE FOR SOLAR CELL ELECTRODE AND SOLAR CELL MANUFACTURED BY USING SAME

TECHNICAL FIELD

The present invention relates to a conductive paste for use in the formation of an electrode of a solar cell and a solar cell manufactured using the same.

BACKGROUND ART

Solar cells are semiconductor devices that convert solar energy into electrical energy, and typically have a p-n junction type, and the basic structure thereof is the same as a diode. FIG. 1 shows the configuration of a general solar cell device. The solar cell device is typically configured using a p-type silicon semiconductor substrate 10 having a thickness of 180 to 250 μm. An n-type impurity layer 20, having a thickness of 0.3 to 0.6 μm, is formed on the light-receiving surface of the silicon semiconductor substrate, and an antireflective film 30 and a front electrode 100 are formed thereon. A rear electrode 50 is also formed on the rear surface of the p-type silicon semiconductor substrate. The front electrode 100 is formed by applying a conductive paste containing conductive particles of silver as a main component (silver powder), a glass frit, an organic vehicle, a solvent and an additive, which are mixed therewith, on the antireflective film 30 and then firing it, and the rear electrode 50 is formed by applying an aluminum paste composition comprising an aluminum powder, a glass frit, an organic vehicle and an additive through a screen-printing process or the like, followed by drying and then firing at a temperature of 660° C. (the melting point of aluminum) or higher. Aluminum is diffused into the p-type silicon semiconductor substrate at the time of firing, whereby an Al—Si alloy layer is formed between the rear electrode and the p-type silicon semiconductor substrate, and simultaneously, a p+ layer 40 is formed as an impurity layer due to the diffusion of aluminum atoms. The presence of this p+ layer prevents the recombination of electrons, and thus a BSF (Back Surface Field) effect, which increases the collection efficiency of the generated carriers, is obtained. A rear silver electrode 60 may be further disposed under the rear aluminum electrode 50.

As for the front electrode of the solar cell, the line width of the electrode has to be decreased in order to minimize light loss caused by light absorption or reflection due to the metal electrode, and the height of the electrode has to be increased for electrode resistance. Typically, in order to increase an aspect ratio of line width to height, a method of changing a screen mesh design of a printing process, a method of changing a printing process such as the introduction of lamination printing or gravure offset printing, and a method of adjusting rheological properties of a conductive paste (Non-Patent Document 1) may be applied.

However, the method of changing the printing process incurs high processing costs, and the method of adjusting the rheological properties of the conductive paste is limited in that the line width is decreased merely by increasing viscosity.

The present invention is intended to provide a method of increasing an aspect ratio by modifying the composition of a conductive paste.

DISCLOSURE

Technical Problem

Accordingly, the present invention has been made keeping in mind the problems encountered in the related art, and an objective of the present invention is to provide a composition for a conductive paste capable of increasing an aspect ratio of a solar cell electrode pattern, thereby increasing the efficiency of a solar cell including an electrode formed of the prepared conductive paste.

However, the objectives of the present invention are not limited to the foregoing, and other objectives which are not mentioned herein will be able to be clearly understood by those skilled in the art from the following description.

Technical Solution

The present invention provides a conductive paste for a solar cell electrode, comprising a metal powder, a glass frit, an organic binder, a silicone-based additive and a solvent, in which the silicone-based additive includes trimethylsiloxy-terminated polydimethylsiloxane represented by Chemical Formula 1 below.

<Chemical Formula 1>

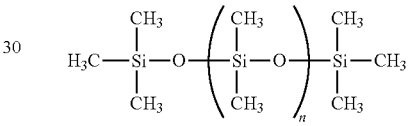

(wherein n is an integer of 1 to 300.)

Also, the silicone-based additive may be contained in an amount of 0.01 to 0.3 wt % based on the total weight of the conductive paste.

Also, the silicone-based additive may further include polyether-modified polydimethylsiloxane represented by Chemical Formula 2 below in an amount of 20 wt % or less based on the total weight of the silicone-based additive.

<Chemical Formula 2>

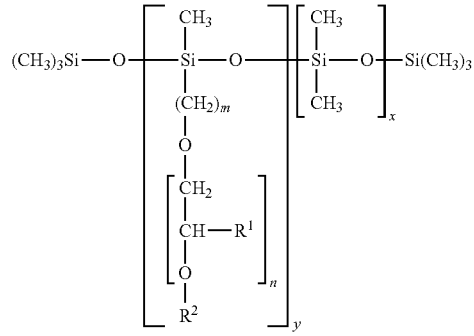

EO: $R^1$ = -H
PO: $R^1$ = -$CH_3$ (wherein $R^1$ is independently selected from among hydrogen and a methyl group, in which hydrogen and a methyl group may coexist in a molecule, m is an integer of 5 to 100, n is an integer of 1 to 10, x is an integer of 1 to 300, and y is an integer of 1 to 100.)

Also, the silicone-based additive may further include octamethyl cyclotetrasiloxane represented by Chemical Formula 3 below in an amount of 5 wt % or less based on the total weight of the silicone-based additive.

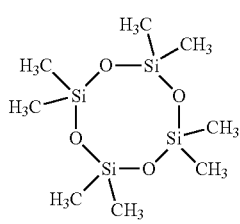

<Chemical Formula 3>

Also, the solvent may further include at least one hydrocarbon-based solvent selected from the group consisting of mineral spirits, YK-D40, YK-D80, YK-D100, YK-D110 and YK-D130, in an amount of 5 wt % or less based on the total weight of the solvent.

In addition, the present invention provides a solar cell comprising a front electrode provided on a substrate and a rear electrode provided under the substrate, wherein the front electrode is manufactured by applying and then firing the conductive paste.

Advantageous Effects

According to the present invention, the composition of an additive and a solvent for use in a conductive paste for a solar cell electrode is adjusted, whereby an aspect ratio, that is, a line width and a line height, of an electrode formed using the prepared conductive paste can be improved, thus increasing conductivity, and also, a solar cell having high power generation efficiency can be provided by enlarging the light-receiving surface through decreasing the line width of the electrode.

Furthermore, the line width of the electrode can be reduced even under the same printing conditions and heat-treatment processing using the conductive paste having the above composition, and an increase in the line width of the electrode after firing can be significantly reduced, thus facilitating the formation of a fine pattern.

Moreover, the conductive paste according to the present invention can be applied to a conventional inexpensive screen-printing process, thus enabling the formation of an electrode having a high aspect ratio without the need to change a pattern design and a printing process.

DESCRIPTION OF DRAWINGS

FIG. 1 shows a schematic cross-sectional view of a typical solar cell device; and FIG. 2 shows line-width images of the electrodes formed using conductive pastes in Examples of the present invention and Comparative Example.

MODE FOR INVENTION

In the following description of the present invention, the terms used herein are merely intended to describe specific embodiments and are not to be construed as limiting the scope of the present invention, which is defined by the appended claims. Unless otherwise defined, all technical or scientific terms used herein have the same meanings as those typically understood by persons having ordinary knowledge in the art to which the present invention belongs.

Unless otherwise stated, the terms "comprise", "comprises" and "comprising" are used to designate the presence of an object, a step or groups of objects and steps described in the specification and claims, and should be understood as not excluding the presence or additional possibility of inclusion of any other objects, steps or groups of objects or steps.

Unless otherwise noted, various embodiments of the present invention may be combined with other embodiments. In particular, any feature that is said to be preferable or favorable may be combined with any other features said to be preferable or favorable. Hereinafter, a description will be given of embodiments of the present invention and effects thereof with reference to the appended drawings.

An embodiment of the present invention pertains to a paste suitable for use in the formation of a solar cell electrode, particularly a conductive paste for a solar cell electrode including a silicone-based additive. More particularly, a conductive paste according to the present invention includes a metal powder, a glass frit, a binder, a silicone-based additive and a solvent. Individual components thereof are described in detail below.

The silicone-based additive includes trimethylsiloxy-terminated polydimethylsiloxane represented by Chemical Formula 1 below. When trimethylsiloxy-terminated polydimethylsiloxane is added as an additive, cohesion in the metal powder becomes strong, and thus surface tension to a wafer is further enhanced, and the line-width improvement effect of an electrode formed using the prepared conductive paste becomes good.

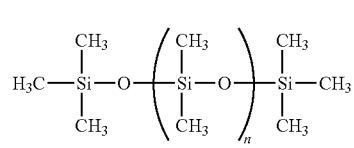

<Chemical Formula 1>

In Chemical Formula 2, n is an integer of 1 to 300.

Also, the silicone-based additive may further include polyether-modified polydimethylsiloxane represented by Chemical Formula 2 below in an amount of 20 wt % or less based on the total weight of the silicone-based additive composition.

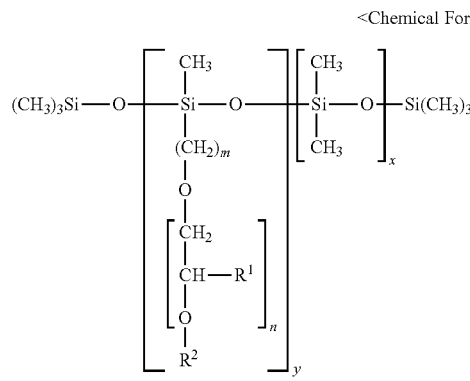

<Chemical Formula 2>

EO: R¹ = -H
PO: R¹ = -CH₃

Here, $R^1$ is independently selected from among hydrogen and a methyl group, in which hydrogen and a methyl group may coexist in a molecule, m is an integer of 5 to 100, n is an integer of 1 to 10, x is an integer of 1 to 300, and y is an integer of 1 to 100.

Also, when both hydrogen and a methyl group are independently selected as $R^1$ and thus an ethylene oxide group (where $R^1$ is hydrogen) and a propylene oxide group (where $R^1$ is a methyl group) coexist in a molecule, the molar ratio of the ethylene oxide group and the propylene oxide group may range from 2:8 to 8:2. It is predicted that strong polarity is obtained through polyether modification to thus decrease the surface tension, thereby reducing an increase in line width during firing. Since the ethylene oxide group is highly polar compared to the propylene oxide group, the molar ratio of the ethylene oxide group and the propylene oxide group preferably ranges from 6:4 to 8:2. In Chemical Formula 1, preferably, m is an integer of 5 to 100, n is an integer of 1 to 10, x is an integer of 1 to 300, y is an integer of 1 to 100, and x:y is in the range of 10:1 to 100:1.

Also, the silicone-based additive may further include cyclosiloxane in a small amount, particularly octamethyl cyclotetrasiloxane represented by Chemical Formula 3 below, in an amount of 5 wt % or less based on the total weight of the silicone-based additive composition.

<Chemical Formula 3>

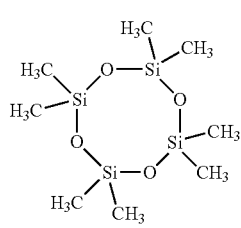

The amount of the silicone-based additive may fall in the range of 0.01 wt % to 0.3 wt % based on the total weight of the paste composition. If the amount thereof is less than the above lower limit, the effect of decreasing the line width is insignificant. On the other hand, if the amount thereof exceeds the above upper limit, the electrical characteristics of the solar cell electrode may become poor or the adhesion of the electrode to the silicon substrate may deteriorate, undesirably incurring a problem of poor contact.

The metal powder may include a silver (Ag) powder, a gold (Au) powder, a platinum (Pt) powder, a nickel (Ni) powder, and a copper (Cu) powder. As the metal powder, any one of the above-listed metal powders, an alloy of the above metals, or a mixed powder of at least two of the above-listed metal powders may be used. Alternatively, a metal powder the surface of which is subjected to treatment such as hydrophilic treatment may be used.

In particular, a silver (Ag) powder, which has high electrical conductivity and is thus mainly used for a front electrode, may be used. The silver powder is preferably a pure silver powder, and other examples thereof may include a silver-coated complex powder having a silver layer on at least a surface thereof, an alloy composed mainly of silver, etc. Also, the silver may be used in combination with another metal powder. For example, aluminum, gold, palladium, copper, nickel, and the like may be used.

The amount of the metal powder preferably falls in the range of 60 to 98 wt % based on the total weight of the conductive paste composition, taking into consideration the thickness and line resistance of an electrode formed upon printing. If the amount thereof is less than 40 wt %, the resistivity of the formed electrode may increase. On the other hand, if the amount thereof exceeds 95 wt %, the amounts of the other components may become insufficient, undesirably making it difficult to uniformly disperse the metal powder.

The silver powder may have an average particle diameter of 0.1 to 10 μm, and preferably has an average particle diameter of 0.5 to 5 μm considering ease of formation of a paste and density upon firing, and the shape thereof may be at least one of a spherical shape, an acicular shape, a planar shape, and an indeterminate shape. The silver powder may be used in a mixture of two or more powders having different average particle diameters, particle size distributions and shapes.

The composition, particle diameter and shape of the glass frit are not particularly limited. Not only a lead-containing glass frit but also a lead-free glass frit may be used. As the components and amounts of the glass frit, 10 to 29 mol % of PbO, 20 to 34 mol % of $TeO_2$, 3 to 20 mol % of $Bi_2O_3$, 20 mol % or less of Sift, and 10 mol % or less of $B_2O_3$ may be used on an oxide basis, and an alkali metal (Li, Na, K, etc.) and an alkaline earth metal (Ca, Mg, etc.) may be contained in an amount of 10 to 20 mol %. When these components are combined in the above amounts, an increase in the line width of the electrode is prevented and superior contact resistance is ensured at high sheet resistance, resulting in superior short-circuit current characteristics.

In particular, if the amount of PbO is too high, environmental consequences are too great and viscosity is excessively decreased upon melting, undesirably increasing the line width of the electrode upon firing. Hence, PbO is preferably contained within the above range in the glass frit. Furthermore, if the amount of PbO exceeds 30 mol % and the amount of the alkali metal and alkaline earth metal is less than the above lower limit, the performance of removal of an $Al_2O_3$ layer from an insulating layer may deteriorate.

Also, the average particle diameter of the glass frit is not particularly limited, but may fall in the range of 0.5 to 10 μm, and the glass frit may be used by mixing a variety of particles having different average particle diameters. Preferably, at least one glass frit has an average particle diameter (D50) of 3 μm to 5 μm. Thereby, reactivity upon firing becomes excellent, and in particular, damage to an n layer at a high temperature may be minimized, adhesion may be enhanced, and superior open voltage (Voc) may result. Moreover, an increase in the line width of the electrode upon firing may be reduced.

Also, the glass transition temperature (Tg) of the glass frit is not particularly limited, but may range from 200 to 600° C., and preferably, the glass transition temperature falls in the range of 200° C. to less than 300° C. When glass frit having a low glass transition temperature of less than 300° C. is used, melting uniformity may increase, and cell characteristic uniformity may also increase. Furthermore, superior contact characteristics may be ensured upon rapid firing at a low temperature, and may be optimized for a solar cell having high sheet resistance (90 to 120 Ω/sq).

The crystallization characteristics of the glass frit may be regarded as an important factor. In a conventional glass frit, the first crystallization temperature in DSC measurement is generally 550° C. or higher, but in the present invention, the first crystallization peak on the DSC measurement data of the glass frit is observed at temperatures below 400° C., whereby crystallization occurs more rapidly upon firing, thus significantly reducing an increase in the line width of the electrode during the firing process, ultimately exhibiting superior electrical characteristics. Preferably, the first crystallization peak on the DSC data appears at temperatures below 400° C., and the second crystallization peak is observed in a temperature range from 400° C. to less than 500° C. It is more preferable that all of the crystallization peaks appear at temperatures below 400° C. on the DSC data.

The amount of the glass frit is preferably 1 to 15 wt % based on the total weight of the conductive paste composition. If the amount thereof is less than 1 wt %, incomplete firing may occur, and thus electrical resistivity may increase, which is undesirable. On the other hand, if the amount thereof exceeds 15 wt %, the glass content in the fired body of the silver powder may become too large, and thus electrical resistivity may increase, which is undesirable.

The organic vehicle including an organic binder and a solvent is used to maintain the uniformly mixed state of the metal powder and the glass frit. For example, when conductive paste is applied onto a substrate through screen printing, the conductive paste is homogenized, thus suppressing the blur and flow of the printed pattern, and moreover, properties that facilitate discharge of the conductive paste from the screen plate and separation of the plate are obtained.

Examples of the organic binder may include a cellulose ester compound such as cellulose acetate, cellulose acetate butyrate and the like, a cellulose ether compound such as ethyl cellulose, methyl cellulose, hydroxypropyl cellulose, hydroxyethyl cellulose, hydroxypropylmethyl cellulose, hydroxyethylmethyl cellulose and the like, an acrylic compound such as polyacrylamide, polymethacrylate, polymethyl methacrylate, polyethyl methacrylate and the like, and a vinyl compound such as polyvinyl butyral, polyvinyl acetate, polyvinyl alcohol, and the like. At least one of these binders may be selected and used.

The amount of the organic binder is not particularly limited, but is preferably 1 to 15 wt % based on the total weight of the conductive paste composition. If the amount of the organic binder is less than 1 wt %, the viscosity of the composition and the adhesion of the formed electrode pattern may decrease. On the other hand, if the amount thereof exceeds 15 wt %, the amounts of the metal powder, the solvent, the dispersant and the like may become insufficient.

The solvent may include at least one selected from among dimethyl adipate, diethylene glycol butyl ether acetate, Texanol, dioctyl phthalate, dibutyl phthalate, diethyleneglycol, ethylene glycol butyl ether, ethylene glycol butyl ether acetate, and diethylene glycol butyl ether. Preferably, dimethyl adipate or diethylene glycol butyl ether acetate is used.

The amount of the solvent is preferably 10 to 25 wt % based on the total weight of the conductive paste composition.

Also, the solvent may further include a hydrocarbon-based solvent, such as mineral spirits, YK-D40, YK-D80, YK-D100, YK-D110, YK-D130 and the like. The hydrocarbon-based solvent may be used in an amount of 5 wt % or less based on the total weight of the solvent composition.

In order to accomplish the desired effects of the present invention, the silicone-based additive includes trimethylsiloxy-terminated polydimethylsiloxane, and thus the line width of the front electrode may be reduced under the same screen-printing conditions and heat-treatment processing. In this case, when a hydrocarbon-based solvent is further included to prepare a conductive paste, conditions for the formation of a fine pattern become favorable.

The electrode formed using the conductive paste including the hydrocarbon-based solvent and the silicone-based additive is improved in aspect ratio, that is, line width and line height, thereby increasing conductivity. Moreover, a solar cell having high power generation efficiency may be provided by enlarging the light-receiving surface through decreasing the line width of the electrode.

The conductive paste composition according to the present invention may further contain, as necessary, a typically known additive, for example, a dispersant, a leveling agent, a plasticizer, a viscosity modifier, a surfactant, an oxidizing agent, a metal oxide, a metal organic compound and the like. The additive is contained in an amount of 0.1 to 5 wt % based on the total weight of the conductive paste composition.

The conductive paste composition for a solar cell electrode may be prepared in a manner in which the metal powder, the glass frit, the organic binder, the solvent and the additive are mixed, dispersed, filtered and defoamed.

In addition, the present invention pertains to a method of forming an electrode for a solar cell, in which the conductive paste is applied on a substrate, dried and fired, and to a solar cell electrode manufactured by the method. Here, a substrate, a printing process, a drying process and a firing process useful in conventional methods for manufacturing solar cells may be applied, with the exception that the conductive paste including the silver powder having the properties above is used in the method of forming a solar cell electrode according to the present invention.

For example, the substrate may be a silicon wafer, and the electrode formed using the paste of the present invention may be a finger electrode or a bus-bar electrode on the front surface, the printing process may be screen printing or offset printing, the drying process may be performed at 90 to 250° C., and the firing process may be conducted at 600 to 950° C. The firing process is carried out through high-temperature/high-speed firing at preferably 800 to 950° C., and more preferably 850 to 900° C., for 5 sec to 1 min, and the printing process may be performed at a thickness of 20 to 60 μm. Particularly, reference may be made to the structures of solar cells and methods of manufacturing the same disclosed in Korean Patent Application Publication Nos. 10-2006-0108550 and 10-2006-0127813 and Japanese Patent Application Publication Nos. 2001-202822 and 2003-133567.

Examples and Comparative Example

A conductive paste was prepared in a manner in which a glass frit, an organic binder (ethyl cellulose resin), a solvent (dimethyl adipate), a hydrocarbon-based solvent (mineral spirit) and a silicone-based additive were added in the amounts shown in Table 1 below, dispersed using a three-roll mill, mixed with a silver powder (having a spherical shape and an average particle diameter of 1 μm), further dispersed using a three-roll mill, and then defoamed under reduced pressure.

TABLE 1

| | No. | | | |
|---|---|---|---|---|
| | Example 1 | Example 2 | Example 3 | Comparative Example 1 |
| Ethyl cellulose resin | 0.5 | 0.5 | 0.5 | 0.5 |
| Dimethyl adipate | 6.3 | 6.3 | 6.0 | 6.6 |
| Mineral spirit | | | 0.3 | |
| Wax | 0.5 | 0.5 | 0.5 | 0.5 |

TABLE 1-continued

| | No. | | | |
|---|---|---|---|---|
| | Example 1 | Example 2 | Example 3 | Comparative Example 1 |
| Silver powder | 90 | 90 | 90 | 90 |
| Glass frit | 1.5 | 1.5 | 2.2 | 1.5 |
| Dispersant 1 (Byk180) | 0.3 | 0.3 | 0.3 | 0.3 |
| Dispersant 2 (EFKA-4330) | 0.2 | 0.2 | 0.2 | 0.2 |
| Silicone-based additive 1 | 0.3 | | | |
| Silicone-based additive 2 | | 0.3 | 0.3 | |

Silicone-based additive 1: Polyether-modified polydimethylsiloxane
Silicone-based additive 2: Trimethylsiloxy-terminated polydimethylsiloxane Test Examples The conductive paste prepared in each of Examples and Comparative Example was pattern-printed on the front surface of a wafer through a screen-printing process using a 35 µm mesh and dried at 200 to 350° C. for 20 sec to 30 sec using a belt-type drying furnace. Thereafter, an aluminum paste was printed on the rear surface of the wafer and dried in the same manner as above. The cell thus formed was fired at 500 to 900° C. for 20 to 30 sec using a belt-type firing furnace, thereby manufacturing a solar cell.

The solar cell thus manufactured was measured for Isc, Voc, Rseries, Rshadow, and efficiency performance using a solar cell efficiency measurement device (cetisPV-Celltest 3, made by Halm). The relative values based on 100, which is the value assigned to Comparative Example, are shown in Table 2 below. Also, the line width and line height of the front electrode were measured, and the results are shown in Table 3 below. The electrode images are shown in FIG. 2.

TABLE 2

| | Isc | Voc | Eff | FF | Rs |
|---|---|---|---|---|---|
| Example 1 | 100.42 | 100.00 | 100.37 | 100.21 | 99.81 |
| Example 2 | 100.74 | 100.00 | 100.66 | 100.39 | 99.12 |
| Example 3 | 100.73 | 100.00 | 100.69 | 100.42 | 98.99 |
| Comparative Example 1 | 100.00 | 100.00 | 100.00 | 100.00 | 100.00 |

TABLE 3

| | Bleeding line width (µm) | Line width (µm) | Line height | Aspect ratio | Number of disconnections |
|---|---|---|---|---|---|
| Example 1 | 51.375 | 38.531 | 15.3 | 0.40 | 7 |
| Example 2 | 50.152 | 34.861 | 16.9 | 0.48 | 5 |
| Example 3 | 50.321 | 34.871 | 16.8 | 0.48 | 0 |
| Comparative Example 1 | 54.433 | 44.647 | 13.2 | 0.30 | 10 |

Given that the efficiency of a solar cell is measured in 0.2% increments and an increase in efficiency of 0.2% is very meaningful, as shown in Table 2, the solar cell including the electrode made of the conductive paste including the solvent according to the present invention is capable of exhibiting high conversion efficiency compared to Comparative Example, thereby manifesting increased power generation efficiency.

As is apparent from Table 3, even under the same printing conditions and heat-treatment processing, when using the conductive paste including trimethylsiloxy-terminated polydimethylsiloxane as the silicone-based additive according to the present invention, the electrode can be found to have a decreased line width and a high aspect ratio compared to Comparative Example, and in Example 3 using the hydrocarbon-based solvent, the most advantageous effect in forming a fine pattern is provided.

The features, structures, effects and the like illustrated in the individual exemplary embodiments above may be combined or modified with other exemplary embodiments by those skilled in the art. Therefore, content related to such combinations or modifications should be understood to fall within the scope of the present invention.

The invention claimed is:

1. A conductive paste for a solar cell electrode, comprising a metal powder, a glass frit, an organic binder, a silicone-based additive, and a solvent,
   wherein the silicone-based additive includes trimethylsiloxy-terminated polydimethylsiloxane represented by Chemical Formula 1 below

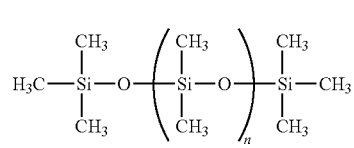

<Chemical Formula 1>

(wherein n is an integer of 1 to 300), and
   wherein the silicone-based additive further includes polyether-modified polydimethylsiloxane represented by Chemical Formula 2 below in an amount of 20 wt % or less based on a total weight of the silicone-based additive

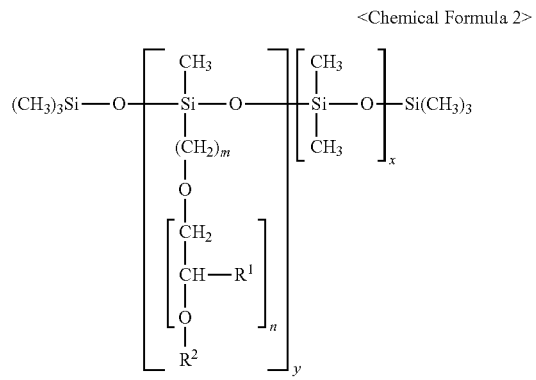

<Chemical Formula 2>

EO: $R^1 = -H$

PO: $R^1 = -CH_3$ (wherein $R^1$ is independently selected from among hydrogen and a methyl group, in which hydrogen and a methyl group are able to coexist in a molecule, m is an integer of 5 to 100, n is an integer of 1 to 10, x is an integer of 1 to 300, and y is an integer of 1 to 100),
   wherein the silicone-based additive is contained in an amount of 0.01 to 0.3 wt % based on a total weight of the conductive paste.

2. The conductive paste of claim 1, wherein the silicone-based additive further includes octamethyl cyclotetrasiloxane represented by Chemical Formula 3 below in an amount of 5 wt % or less based on a total weight of the silicone-based additive.

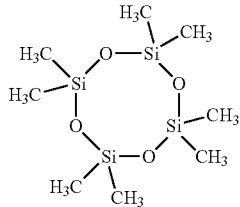

<Chemical Formula 3>

3. The conductive paste of claim 1, wherein the solvent includes at least one selected from the group consisting of dimethyl adipate, diethylene glycol butyl ether acetate, Texanol, dioctyl phthalate, dibutyl phthalate, diethyleneglycol, ethylene glycol butyl ether, ethylene glycol butyl ether acetate, and diethylene glycol butyl ether.

4. The conductive paste of claim 1, wherein the solvent further includes at least one hydrocarbon-based solvent in an amount of 5 wt % or less based on a total weight of the solvent.

5. The conductive paste of claim 1, wherein the metal powder is a powder having an average particle diameter of 0.1 to 10 μm and includes at least one selected from the group consisting of a silver (Ag) powder, a gold (Au) powder, a platinum (Pt) powder, a nickel (Ni) powder, and a copper (Cu) powder.

6. The conductive paste of claim 1, wherein the glass frit has an average particle diameter of 0.5 to 10 μm and a glass transition temperature (Tg) of 200 to 300° C.

7. The conductive paste of claim 1, wherein the organic binder includes at least one selected from the group consisting of a cellulose ester compound, a cellulose ether compound, an acrylic compound, and a vinyl compound.

8. A solar cell, comprising a front electrode provided on a substrate and a rear electrode provided under the substrate,
wherein the front electrode is manufactured by applying and then firing the conductive paste of claim 1.

9. The conductive paste of claim 1, wherein a first crystallization temperature of the glass frit is less than 400° C.

10. The conductive paste of claim 9, wherein a second crystallization temperature of the glass frit is less than 500° C.

11. The conductive paste of claim 9, wherein a second crystallization temperature of the glass frit is less than 400° C.

12. The conductive paste of claim 1, wherein R1 includes both the hydrogen, and the methyl group, and a molar ratio of units in which R1 is the hydrogen to unit in which R1 is the methyl group is from 2:8 to 8:2.

13. The conductive paste of claim 12, wherein R1 includes both the hydrogen, and the methyl group, and a molar ratio of units in which R1 is the hydrogen to unit in which R1 is the methyl group is from 6:4 to 8:2.

* * * * *